(12) United States Patent
Kim et al.

(10) Patent No.: US 11,355,288 B2
(45) Date of Patent: Jun. 7, 2022

(54) ELECTRONIC COMPONENT AND BOARD HAVING THE SAME MOUNTED THEREON

(71) Applicant: SAMSUNG ELECTRO-MECHANICS CO., LTD., Suwon-si (KR)

(72) Inventors: Ki Young Kim, Suwon-si (KR); Jae Young Na, Suwon-si (KR); Beom Joon Cho, Suwon-si (KR); Ji Hong Jo, Suwon-si (KR); Woo Chul Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 47 days.

(21) Appl. No.: 16/914,942

(22) Filed: Jun. 29, 2020

(65) Prior Publication Data

US 2021/0082627 A1  Mar. 18, 2021

(30) Foreign Application Priority Data

Sep. 18, 2019 (KR) .................. 10-2019-0115004

(51) Int. Cl.
 *H01G 4/005* (2006.01)
 *H01G 4/228* (2006.01)
 (Continued)

(52) U.S. Cl.
 CPC ............. *H01G 4/385* (2013.01); *H01G 4/005* (2013.01); *H01G 4/228* (2013.01); *H01G 4/30* (2013.01);
 (Continued)

(58) Field of Classification Search
 CPC .. H01G 2/02; H01G 2/06; H01G 2/10; H01G 4/435; H01G 4/005; H01G 4/228;
 (Continued)

(56) References Cited

U.S. PATENT DOCUMENTS 6,515,842 B1 * 2/2003 Hayworth ............... H01C 7/10
361/303
2011/0058306 A1 3/2011 Lee et al.
(Continued)

FOREIGN PATENT DOCUMENTS

JP 2017-125649 A 7/2017
JP 2019-9359 A 1/2019
(Continued)

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

An electronic component is provided, and the electronic component includes: a capacitor array in which a plurality of multilayer capacitors are stacked, the plurality of multilayer capacitors including a body, and first and second external electrodes; first and second metal frames including first and second support portions bonded to the first and second external electrodes of the capacitor array, first and second mounting portions located below the first and second external electrodes and having first and second protrusions protruding downwardly, and first and second connection portions connecting the first and second support portions to the first and second mounting portions, respectively; and a capsule portion encapsulating the capacitor array to expose the first mounting portion of the first metal frame and the second mounting portion of the second metal frame, and having a lower surface provided with a plurality of protruding portions are formed at predetermined intervals.

20 Claims, 13 Drawing Sheets

(51) Int. Cl.
H01G 4/30 (2006.01)
H01G 4/38 (2006.01)
H05K 1/18 (2006.01)
H05K 1/11 (2006.01)

(52) U.S. Cl.
CPC ............... H05K 1/11 (2013.01); H05K 1/181 (2013.01); H05K 2201/10015 (2013.01)

(58) Field of Classification Search
CPC ............ H01G 4/30; H01G 4/12; H01G 4/224; H01G 4/0085; H01G 4/012; H01G 4/1218; H01G 4/1236; H01G 4/232; H01G 4/2325; H01G 4/385; H01G 4/38; H05K 1/11; H05K 1/181; H05K 2201/10015; H05K 1/18
USPC ...... 174/260; 361/301.4, 321.5, 321.4, 321.2
See application file for complete search history.

(56) References Cited

U.S. PATENT DOCUMENTS

| | | | |
|---|---|---|---|
| 2014/0055910 A1* | 2/2014 | Masuda | H01G 4/38 361/303 |
| 2018/0374639 A1 | 12/2018 | Akiyoshi | |
| 2018/0374640 A1 | 12/2018 | Akiyoshi | |
| 2019/0096582 A1* | 3/2019 | Saito | H05K 1/181 |
| 2020/0075262 A1* | 3/2020 | Cho | H01G 4/38 |
| 2020/0176738 A1* | 6/2020 | Tsuruta | H01M 50/55 |
| 2020/0203076 A1* | 6/2020 | Ando | H01G 2/065 |
| 2020/0294718 A1* | 9/2020 | Majima | H01G 4/32 |

FOREIGN PATENT DOCUMENTS

| | | |
|---|---|---|
| JP | 2019-9360 A | 1/2019 |
| KR | 10-1067178 B1 | 9/2011 |

* cited by examiner

I-I'

I - I'

ELECTRONIC COMPONENT AND BOARD HAVING THE SAME MOUNTED THEREON

CROSS-REFERENCE TO RELATED APPLICATION(S)

The present application claims the benefit of priority to Korean Patent Application No. 10-2019-0115004 filed on Sep. 18, 2019 in the Korean Intellectual Property Office, the disclosure of which is incorporated herein by reference in its entirety.

TECHNICAL FIELD

The present disclosure relates to an electronic component and a board having the same mounted thereon.

BACKGROUND

Multilayer capacitors are used in various electronic devices due to their small size and high capacity.

Recently, due to the rapid rise of eco-friendly vehicles and electric vehicles, power driving systems in automobiles are increasing, and thus demand for multilayer capacitors required for automobiles is increasing.

High levels of thermal reliability, electrical reliability, and mechanical reliability are required in order to be used as automotive components, and thus the performance, required for a multilayer capacitor, is also being gradually advanced.

Accordingly, there is demand for a structure of a multilayer capacitor, highly resistant to vibrations and deformation.

In order to improve resistance to vibrations and deformation, an electronic component having a structure in which a multilayer capacitor is mounted at a predetermined interval from a board using a metal frame is disclosed.

In addition, a stacked capacitor array in which a plurality of multilayer capacitors are stacked in order to increase the capacity of the product is disclosed.

However, when the metal frame, described above, is applied to such a capacitor array, the capacitor array is relatively heavier than a single stacked capacitor, which may cause a problem in which a metal frame could not stably support the capacitor array.

In order to solve this problem, a structure is disclosed, in which a capacitor array is encapsulated with an outer resin material and a protruding portion is formed on a lower surface of the capacitor array to support the capacitor array.

However, in the prior art, only one protruding portion is applied to a lower surface of the exterior resin material. Thus, when an electronic component is mounted on a board, a problem may occur, in which flatness of a capsule portion formed of an exterior resin material is distorted to reduce the locational accuracy of an electronic component.

SUMMARY

An aspect of the present inventive concept is to provide an electronic component and a board having the electronic component mounted thereon, wherein a metal frame structure is applied, in which a capacitor array including a plurality of multilayer capacitors is applied, a metal frame stably supports a capacitor array, and flatness of a capsule portion is prevented from being distorted when an electronic component is mounted on a board to prevent locational accuracy of an electronic component from being degraded.

According to an aspect of the present inventive concept, an electronic component includes: a capacitor array having a plurality of multilayer capacitors stacked in at least one of a first direction, a second direction intersecting the first direction, or a third direction, perpendicular to the first and second directions, the plurality of multilayer capacitors each including a body and first and second external electrodes disposed on both ends of the body in the first direction, respectively; a first metal frame including a first support portion attached to the first external electrodes of the capacitor array, a first mounting portion located below the first external electrodes and having a first protrusion protruding downwardly, and a first connection portion connecting the first support portion to the first mounting portion; a second metal frame including a second support portion attached to the second external electrodes of the capacitor array, a second mounting portion located below the second external electrodes and having a second protrusion protruding downwardly, and a second connection portion connecting the second support portion to the second mounting portion; and a capsule portion encapsulating the capacitor array to expose the first mounting portion of the first metal frame and the second mounting portion of the second metal frame, and having a plurality of protruding portions on a lower surface of the capsule portion with predetermined intervals therebetween.

A lower end of each of the plurality of protruding portions may be located below the first and second mounting portions.

The plurality of protruding portions may include one protruding portion in the vicinity of each of both edges opposing each other in the second direction on the lower surface of the capsule portion.

The plurality of protruding portions may include two or more protruding portions spaced apart from each other in the first direction in the vicinity of each of both edges opposing each other in the second direction on the lower surface of the capsule portion.

Each of the plurality of protruding portions may be located in the center of the capsule portion in the first direction. Each of the protruding portions may be arranged in a position offset from the center of the capsule portion in the first direction.

The plurality of protruding portions may be arranged on the lower surface of the capsule portion so as to be positioned diagonally with respect to the second direction.

A lower end of the plurality of protruding portions may have any one of a triangular shape having a lower end which is pointed, a semicircular shape having a lower end which is convex, or a quadrangular shape having a lower end which is flat.

A lowermost end of the plurality of protruding portions may be arranged in a height lower than or equal to a height of the first and second mounting portions in the third direction.

The plurality of multilayer capacitors may be arranged side by side in the second direction. The first connection portion may include a first vertical portion extending upwardly from one end of the first mounting portion in the third direction, a first horizontal portion extending horizontally from the first vertical portion in the first direction, and a second vertical portion extending downwardly from one end of the first horizontal portion in the third direction and having one end to which the first support portion is connected. The second connection portion may include a third vertical portion extending upwardly from one end of the second mounting portion in the third direction, a second horizontal portion extending horizontally from the third vertical portion in the first direction, and a fourth vertical portion extending downwardly from one end of the second horizontal portion in the third direction and having one end to which the second support portion is connected. The first external electrodes are attached to an upper surface of the first support portion, and the second external electrodes are attached to an upper surface of the second support portion.

The second and fourth vertical portions may be spaced apart from the first and second external electrodes, respectively.

A conductive bonding layer may be disposed on each of the upper surfaces of the first and second support portions.

The plurality of multilayer capacitors may be arranged side by side in the second direction and arranged in two rows in the third direction. The first connection portion may include a fifth vertical portion extending upwardly from one end of the first mounting portion in the third direction, a third horizontal portion extending horizontally from the fifth vertical portion in the first direction, and a sixth vertical portion extending upwardly from one end of the third horizontal portion in the third direction and having one end to which the first support portion is connected. The second connection portion may include a seventh vertical portion extending upwardly from one end of the second mounting portion in the third direction, a fourth horizontal portion extending horizontally from the seventh vertical portion in the first direction, and an eighth vertical portion extending upwardly from one end of the fourth horizontal portion in the third direction and having one end to which the second support portion is connected. The first external electrodes in a first row of a lower side and in a second row of an upper side may be attached to upper and lower surfaces of the first support portion, respectively, and the second external electrodes in the first row and the second row may be attached to upper and lower surfaces of the second support portion, respectively.

The sixth and eighth vertical portions may be spaced apart from the first and second external electrodes in the first row of the lower side, respectively.

A conductive bonding layer may be disposed on each of the upper and lower surfaces of the first support portion and each of the upper and lower surfaces of the second support portion.

Each of the first and second protrusions may be provided as a plurality of protrusions.

The body of each of the plurality of multilayer capacitors includes: a dielectric layer; and first and second internal electrodes alternatively stacked with the dielectric layer interposed therebetween, and exposed through both surfaces of the body in the first direction to allow one ends to be connected to the first and second external electrodes, respectively.

The first and second external electrodes include: first and second head portions disposed on both surfaces of the body in the first direction, respectively; and first and second band portions extending from the first and second head portions to a portion of a lower surface of the body, respectively.

The first and second support portions of the first and second metal frames are attached to the first and second band portions of the first and second external electrodes, respectively.

According to another aspect of the present disclosure, a board having an electronic component mounted thereon includes: a board having first and second land patterns spaced apart from each other on an upper surface of the board, and the electronic component mounted to allow the first and second protrusions to be in contact with the first and second land patterns of the board.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
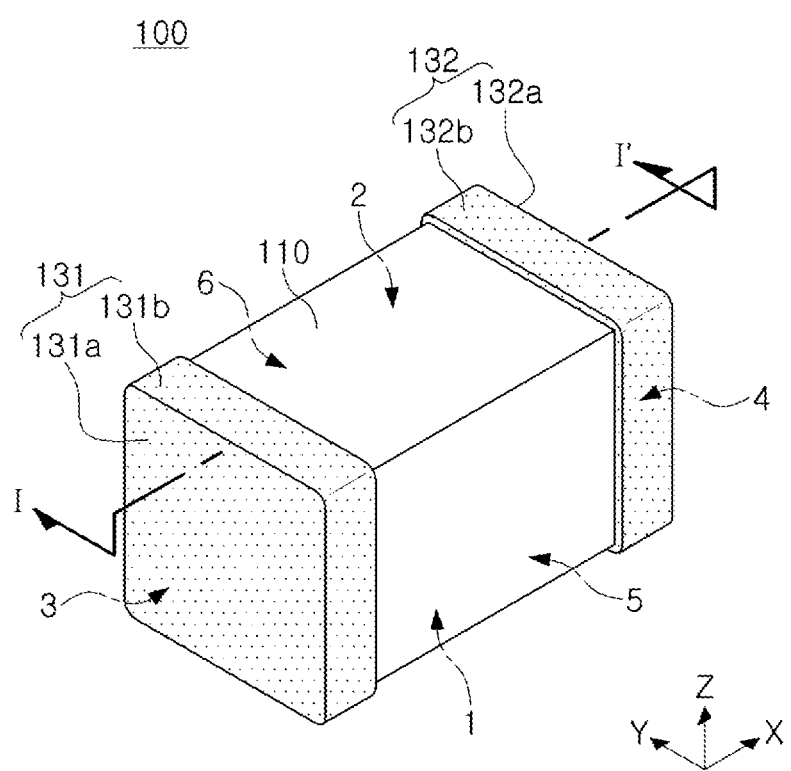
FIG. 1 is a schematic perspective view of a multilayer capacitor applied to an embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to"

another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

An electronic component according to an embodiment of the present disclosure includes a capacitor array in which a plurality of multilayer capacitors are stacked in at least one of a second direction, intersecting a first direction, and a third direction, perpendicular to the first direction, the plurality of multilayer capacitors including a body, and first and second external electrodes formed on both ends of the body in the first direction, respectively, a first metal frame including a first support portion bonded to the first external electrodes of the capacitor array, a first mounting portion located below the first external electrode and having a first protrusion protruding downwardly, and a first connection portion connecting the first support portion to the first mounting portion, a second metal frame including a second support portion bonded to the second external electrodes of the capacitor array, a second mounting portion located below the second external electrode and having a second protrusion protruding downwardly, and a second connection portion connecting the second support portion to the second mounting portion, and a capsule portion encapsulating the capacitor array to expose the first mounting portion of the first metal frame and the second mounting portion of the second metal frame, and having a lower surface provided with a plurality of protruding portions, are formed at predetermined intervals.

When orientations are defined to clearly describe an embodiment in the present disclosure, X, Y, and Z on the drawings indicate a length direction (or a first direction), a width direction (or a second direction), and a thickness direction (or a third direction) of a multilayer capacitor and an electronic component, respectively.

Here, in an embodiment, a Z direction may be used as having the same meaning as a stacking direction in which dielectric layers are stacked on each other.

Figure 2A:
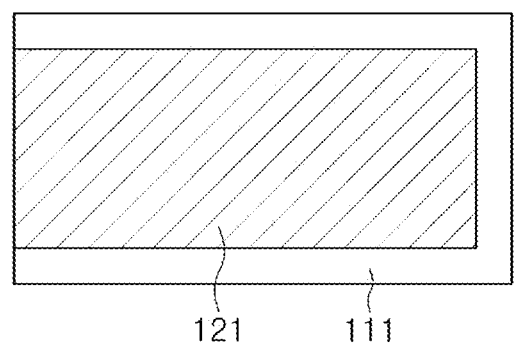
FIGS. 2A and 2B are plan views illustrating first and second internal electrodes, respectively, applied to the multilayer capacitor of FIG. 1.
Figure 2B:
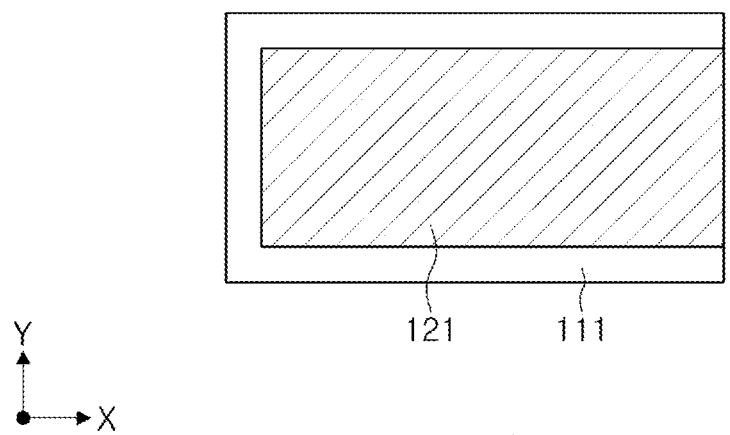
Figure 3:
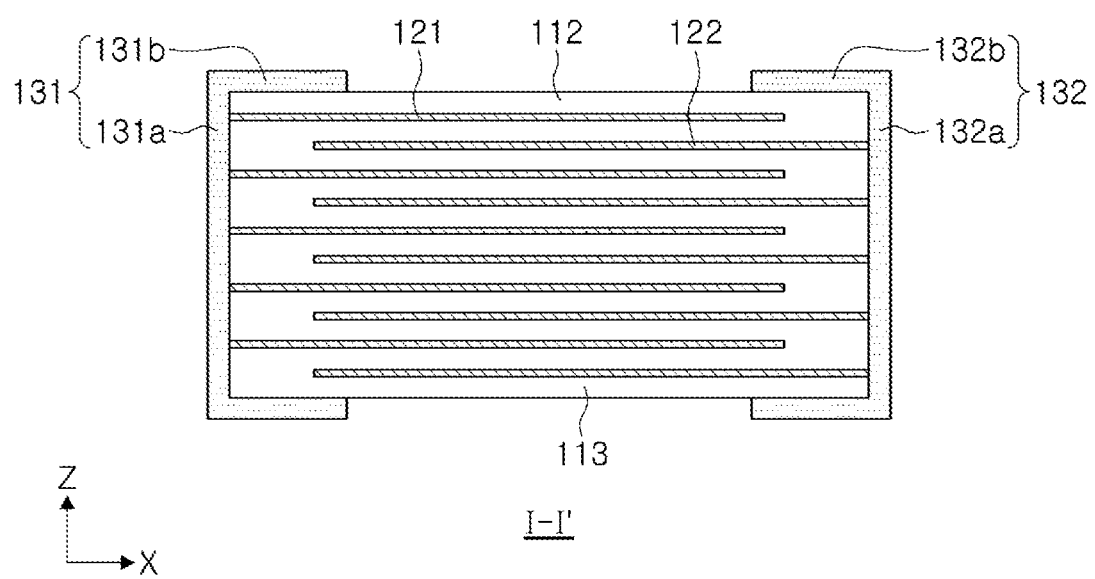
FIG. 3 is a cross-sectional view taken along line I-I' of FIG. 1.

FIG. 1 is a schematic perspective view illustrating a multilayer capacitor applied to an embodiment of the present disclosure, FIGS. 2A and 2B are plan views illustrating first and second internal electrodes applied to the multilayer capacitor of FIG. 1, and FIG. 3 is a cross-sectional view taken along line I-I' of FIG. 1.

First, referring to FIGS. 1 to 3, a structure of a multilayer capacitor 100, applied to an electronic component according to an embodiment, will be described.

Referring to FIGS. 1 to 3, a multilayer capacitor 100 according to an embodiment includes a body 110, and first and second external electrodes 131 and 132 formed on both ends of the body 110 in the X direction, respectively.

A plurality of dielectric layers 111, forming the body 110, are stacked in the Z direction and then sintered, and adjacent dielectric layers 111 of the body 110 are integrated so that boundaries therebetween may not be readily apparent without using a scanning electron microscope (SEM).

In addition, the body 110 includes a plurality of dielectric layers 111 and first and second internal electrodes 121 and 122 having different polarities and alternately arranged in the Z direction with the dielectric layer 111 interposed therebetween.

Moreover, the body 110 may include an active region as a portion contributing to formation of capacitance of a capacitor, and cover regions 112 and 113 formed in an upper portion and a lower portion of the active region in the Z direction as margin portions.

The body 110, described above, has a shape without limitation, and may have a hexahedral shape, and may include a first surface 1 and a second surface 2, opposing each other in the Z direction, a third surface 3 and a fourth surface 4, connected to the first surface 1 and the second surface 2 and opposing each other in the X direction, and a fifth surface 5 and a sixth surface 6, connected to the first surface 1 and the second surface 2, connected to the third surface 3 and the fourth surface 4 and opposing each other.

The dielectric layer 111 may include ceramic powder, for example, $BaTiO_3$-based ceramic powder, or the like.

The BaTiO$_3$-based ceramic powder may be (Ba$_{1-x}$Ca$_x$)TiO$_3$, Ba(Ti$_{1-y}$Ca$_y$)O$_3$, (Ba$_{1-x}$Ca$_x$)(Ti$_{1-y}$Zr$_y$)O$_3$, Ba(Ti$_{1-y}$Zr$_y$)O$_3$, or the like, in which Ca or Zr is partially dissolved in BaTiO$_3$, but an embodiment of the present disclosure is not limited thereto.

Moreover, a ceramic additive, an organic solvent, a plasticizer, a binder, a dispersant, or the like may also be added to the dielectric layers 111 along with the ceramic powder.

The ceramic additive may include, for example, a transition metal oxide or a transition metal carbide, a rare earth element, magnesium (Mg), aluminum (Al), or the like.

The first and second internal electrodes 121 and 122 are electrodes to which charges having different polarities are applied, are formed on the dielectric layer 111 and stacked on the Z direction, and may be arranged alternately to oppose each other in the Z direction inside the body 110 with a single dielectric layer 111 interposed therebetween.

In this case, the first and second internal electrodes 121 and 122 may be electrically isolated from each other by the dielectric layers 111 interposed therebetween.

Meanwhile, a structure in which internal electrodes are stacked in the Z direction is illustrated and described in an embodiment of the present disclosure. However, an embodiment of the present disclosure is not limited thereto and may be applied to a structure in which internal electrodes are stacked in the Y direction, as necessary.

One ends of the first and second internal electrodes 121 and 122 may be exposed through the third surface S3 and the fourth surface S4 of the body 110, respectively.

End portions of the first and second internal electrodes 121 and 122, alternately exposed through the third surface 3 and the fourth surface 4 of the body 110, may be in contact with and electrically connected to the first and second external electrodes 131 and 132, disposed on both ends of the body 110 in the X direction, to be described later.

According to the above configuration, when a predetermined voltage is applied to the first and second external electrodes 131 and 132, charges are accumulated between the first and second internal electrodes 121 and 122.

In this case, the capacitance of the multilayer capacitor 100 is proportional to an area of overlap between the first and second internal electrodes 121 and 122, overlapped in the Z direction in an active region.

In addition, a material, forming the first and second internal electrodes 121 and 122, is not particularly limited. For example, the first and second internal electrodes may be formed using a precious metal material or a conductive paste formed of at least one between nickel (Ni) and copper (Cu).

In this case, a method of printing the conductive paste such as screen printing or gravure printing may be used, but the present disclosure is not limited thereto.

Voltages having different polarities are provided for the first and second external electrodes 131 and 132, and the first and second external electrodes are disposed in both ends of the body 110 in the X direction and are in contact with and electrically connected to exposed end portions of the first and second internal electrodes 121 and 122.

The first external electrode 131 may include a first head portion 131a and a first band portion 131b.

The first head portion 131a is disposed on the third surface 3 of the body 110, and in contact with an end portion exposed externally through the third surface 3 of the body 110 in the first internal electrode 121 to physically and electrically connect the first internal electrode 121 to the first external electrode 131.

The first band portion 131b is a portion extended from the first head portion 131a to a portion of the first surface 1 of the body 110.

In this case, the first band portion 131b may be further extended to portions of the second surface 2, the fifth surface 5, and the sixth surface 6, of the body 110 from the first head portion 131a, to improve adhesion strength.

The second external electrode 132 may include a second head portion 132a and a second band portion 132b.

The second head portion 132a is disposed on the fourth surface 4 of the body 110, and in contact with an end portion exposed externally through the fourth surface 4 of the body 110 in the second internal electrode 122 to physically and electrically connect the second internal electrode 122 to the second external electrode 132.

The second band portion 132b is a portion extended from the second head portion 132a to a portion of the first surface 1 of the body 110.

In this case, the second band portion 132b may be further extended to portions of the second surface 2, the fifth surface 5, and the sixth surface 6, of the body 110 from the second head portion 132a, to improve adhesion strength.

In an embodiment, the first and second external electrodes 131 and 132 are provided as a sintered electrode including at least one metal component selected from copper (Cu) and nickel (Ni), and do not include a precious metal.

Moreover, the first and second external electrodes 131 and 132 are formed of a sintered metal including copper, and first and second plating layers may be further formed on surfaces of the first and second external electrodes.

In addition, the first and second plating layers include first and second nickel plating layers covering surfaces of the first and second external electrodes 131 and 132 and first and second tin (Sn) plating layers covering the first and second nickel plating layers.

Figure 4:
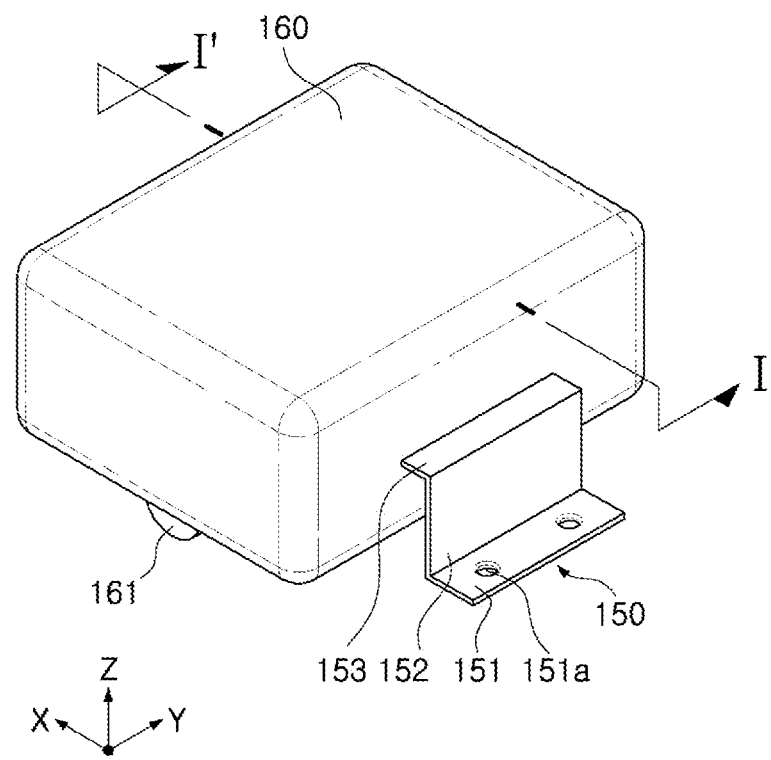
FIG. 4 is a perspective view illustrating an electronic component according to an embodiment of the present disclosure.
Figure 5:
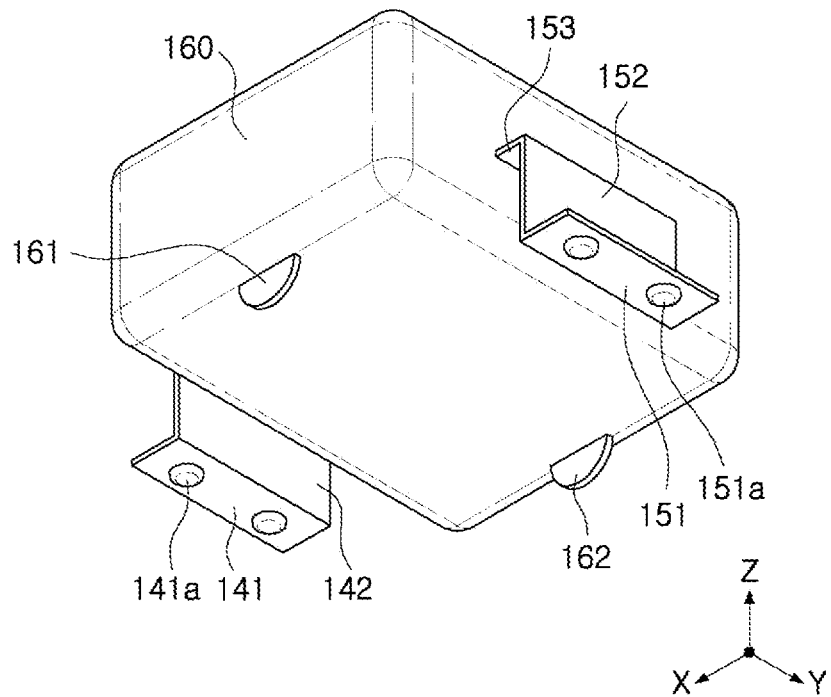
FIG. 5 is a perspective view illustrating a bottom surface of a capsule portion in FIG. 4.
Figure 8:
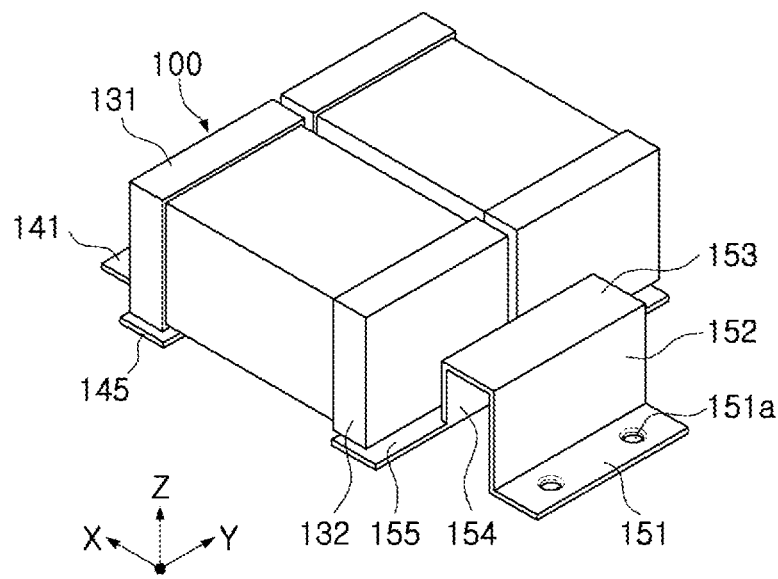
FIG. 8 is a perspective view illustrating the electronic component of FIG. 4 from which a capsule portion is removed.
Figure 9:
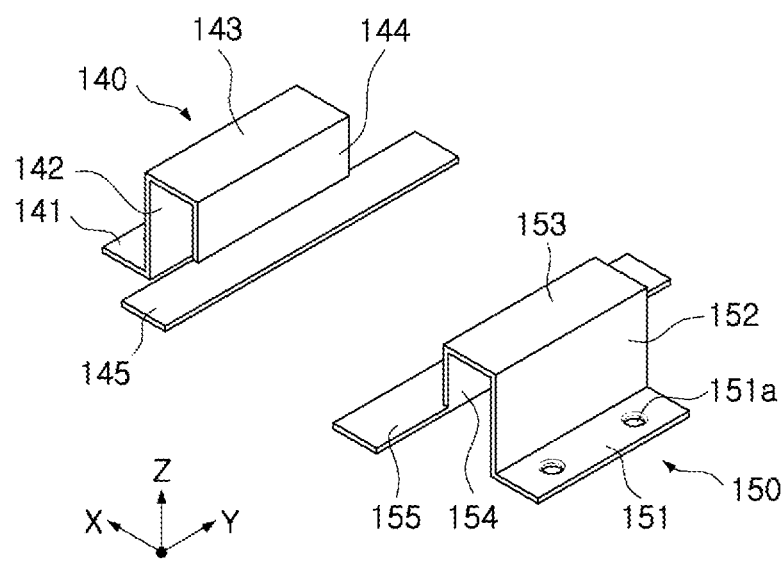
FIG. 9 is a perspective view illustrating first and second metal frames in FIG. 4.
Figure 10:
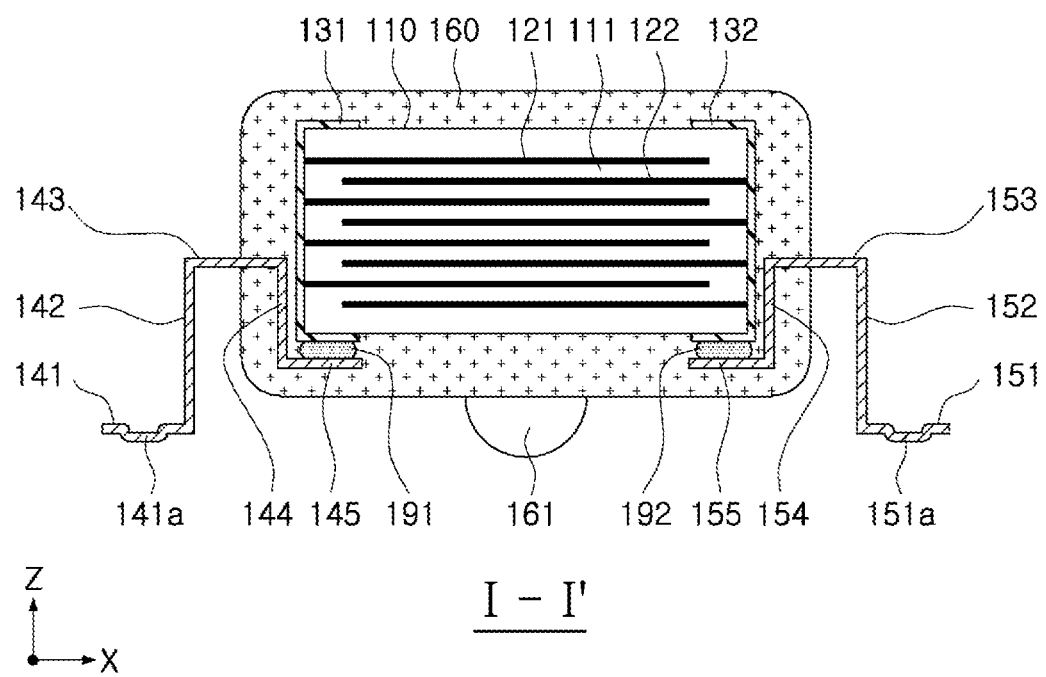
FIG. 10 is a cross-sectional view taken along line I-I' of FIG. 4.

FIG. 4 is a perspective view illustrating an electronic component according to an embodiment of the present disclosure, FIG. 5 is a perspective view illustrating a bottom surface of a capsule portion in FIG. 4, FIG. 8 is a perspective view illustrating the electronic component in FIG. 4 from which the capsule portion is removed, FIG. 9 is a perspective view illustrating first and second metal frames in FIG. 4, and FIG. 10 is a cross-sectional view taken along line I-I' of FIG. 4.

Referring to FIGS. 4, 5, and 8 to 10, an electronic component according to an embodiment includes a capacitor array in which two multilayer capacitors 100 are stacked in the Y direction, a second direction, a first metal frame 140 connected to the first external electrodes 131 of the capacitor array, a second metal frame 150 connected to the second external electrodes 132 of the capacitor array, and a capsule portion 160.

The first metal frame 140 includes a first support portion 145, a first mounting portion 141, and a first connection portion.

The first support portion 145, a portion bonded to the first band portion 131b of two first external electrodes 131, may be electrically and physically connected to the first band portion 131b of the two first external electrodes 131.

The first mounting portion 141, a portion located below the two first external electrodes 131 in the Z direction, may serve as a connection terminal when being mounted on a board.

Moreover, the first mounting portion 141 is provided with a first protrusion 141a protruding downwardly on a lower surface.

The first protrusion 141a is a portion provided to be in contact with a land pattern for laser welding when an electronic component is mounted on a board.

In an embodiment, it is illustrated and described that two first protrusions 141a are spaced apart from each other in the Y direction, but the first protrusion may be provided as only one first protrusion or three or more first protrusions on a lower surface of the first mounting portion.

The first connection portion is a portion connecting the first support portion 145 to the first mounting portion 141, and may include a first vertical portion 142 extending upwardly from one end of the first mounting portion 141, a first horizontal portion 143 extending horizontally from the first vertical portion 142, and a second vertical portion 144 extending downwardly from one end of the first horizontal portion 143 and having one end to which the first support portion 145 is connected.

According to a staircase structure of the first connection portion, load, transmitted from the capacitor array, is distributed to more stably support the capacitor array by the first metal frame 140, and an elastic force of the first metal frame 140 is increased to further reduce vibrations transmitted from the capacitor array.

In this case, the first band portion 131b of the first external electrodes 131 may be bonded to an upper surface of the first support portion 145.

The second metal frame 150 includes a second support portion 155, a second mounting portion 151, and a second connection portion.

The second support portion 155, a portion bonded to the second band portion 132b of two second external electrodes 132, may be electrically and physically connected to the second band portion 132b of the two second external electrode 132.

The second mounting portion 142, a portion located below the two second external electrodes 132 in the Z direction, may serve as a connection terminal when being mounted on a board.

Moreover, the second mounting portion 151 is provided with a second protrusion 151a protruding downwardly on a lower surface.

The second protrusion 151a is a portion provided to be in contact with a land pattern for laser welding when an electronic component is mounted on a board.

In an embodiment, it is illustrated and described that two second protrusions 151a are spaced apart from each other in the Y direction, but the second protrusion may be provided as only one second protrusion or three or more second protrusions on a lower surface of the second mounting portion.

The second connection portion is a portion connecting the second support portion 155 to the second mounting portion 151, and may include a third vertical portion 152 extending upwardly from one end of the second mounting portion 151, a second horizontal portion 153 extending horizontally from the third vertical portion 152, and a fourth vertical portion 154 extending downwardly from one end of the second horizontal portion 153 and having one end to which the second support portion 155 is connected.

According to one exemplary embodiment, the second and fourth vertical portions 144 and 154 may be spaced apart from the first and second external electrodes 131 and 132, respectively.

According to a staircase structure of the second connection portion, load, transmitted from the capacitor array, is distributed to more stably support the capacitor array by the second metal frame 150, and an elastic force of the second metal frame 150 is increased to further reduce vibrations transmitted from the capacitor array.

In this case, the second band portion 132b of the second external electrodes 132 may be bonded to an upper surface of the second support portion 155.

In addition, a first conductive bonding layer 191 is disposed between the first external electrode 131 and the first support portion 145, while a second conductive bonding layer 192 is disposed between the second external electrode 132 and the second support portion 155.

The first conductive bonding layer 191 may be disposed between the first band portion 131b of the first external electrode 131 and the first support portion 145 of the first metal frame 140.

Moreover, the first conductive bonding layer 191 may be formed of the same metal component as a metal component of the first band portion 131b of the first external electrode 131 as a main component.

The second conductive bonding layer 192 may be disposed between the second band portion 132b of the second external electrode 132 and the second support portion 155 of the second metal frame 150.

Moreover, the second conductive bonding layer 192 may be formed of the same metal component as a metal component of the second band portion 132b of the second external electrode 132 as a main component.

The capsule portion 160 may encapsulate the capacitor array to expose the first mounting portion 141 of the first metal frame 140 and the second mounting portion 151 of the second metal frame 150.

The capsule portion 160 may serve to improve moisture resistance reliability, and may be formed of a resin material such as epoxy or silica based epoxy molding compound (EMC), but an embodiment of the present disclosure is not limited thereto.

In this case, a plurality of protruding portions 161 and 162 are formed on a lower surface of the capsule portion 160.

The protruding portion is located between the capsule portion 160 and the board to stably support the weight of the capacitor array when an electronic component is mounted on a board.

Moreover, in an embodiment, the protruding portions 161 and 162 are provided as a plurality of protruding portions formed on a lower surface of the capsule portion to prevent flatness of the capsule portion 160 from being distorted when an electronic component is mounted on a board, so degradation of positional accuracy of the electronic component may be prevented.

Moreover, a plurality of protruding portions 161 and 162 may preferably have a lowermost end arranged in a height lower than or equal to a height of the first and second mounting portions 141 and 151 so as to stably support the capsule portion.

In addition, the plurality of protruding portions 161 and 162 may be provided as a protruding portion in the vicinity of each of both edges opposing each other in the Y direction on a lower surface of the capsule portion.

In this case, each of the protruding portions 161 and 162 may be located in the center of the capsule portion 160 in the X direction, the first direction.

However, an embodiment of the present disclosure is not limited thereto, and each of the protruding portions 161 and 162 may be located in a position offset from the center of the capsule portion 160, the first direction, and the protruding portions may be formed one by one in positions, which are not positions opposing each other in the Y direction if necessary.

Figure 6:
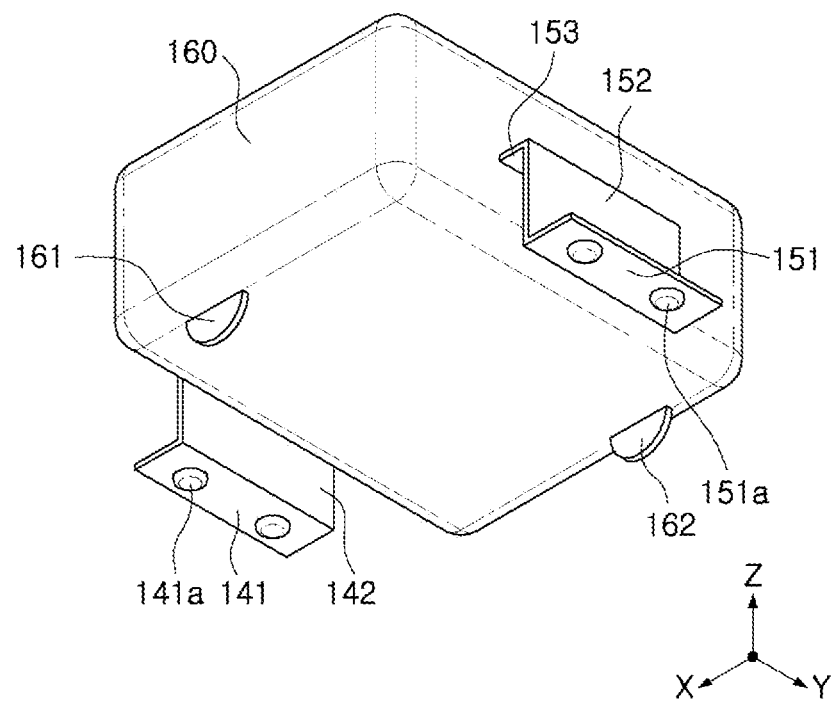
FIGS. 6 and 7 are perspective views illustrating modified examples of a protruding portion, respectively.

For example, as illustrated in FIG. 6, each of two protruding portions 161 and 162 may be formed on a lower surface of the capsule portion 160 so as to be positioned diagonally with respect to the Y direction.

Figure 7:
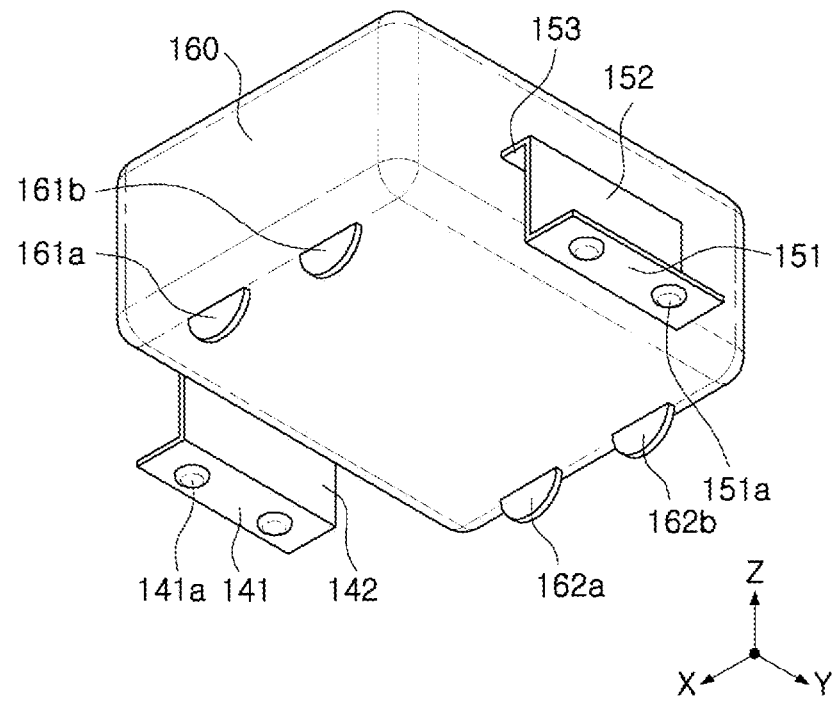

Moreover, as illustrated in FIG. 7, each of the protruding portions 161a, 161b, 162a, and 162b according to an embodiment of the present disclosure may be provided as two or more protruding portions spaced apart from each other in the X direction in the vicinity of both edges opposing each other on a lower surface of the capsule portion 160.

In addition, in FIG. 7, it is illustrated that two protruding portions are spaced apart from each other in the X direction in the vicinity of one edge of a capsule portion, but an embodiment of the present disclosure is not limited thereto. Alternatively, three or more protruding portions may be spaced apart from each other in the vicinity of one edge of a capsule portion.

Figure 17:
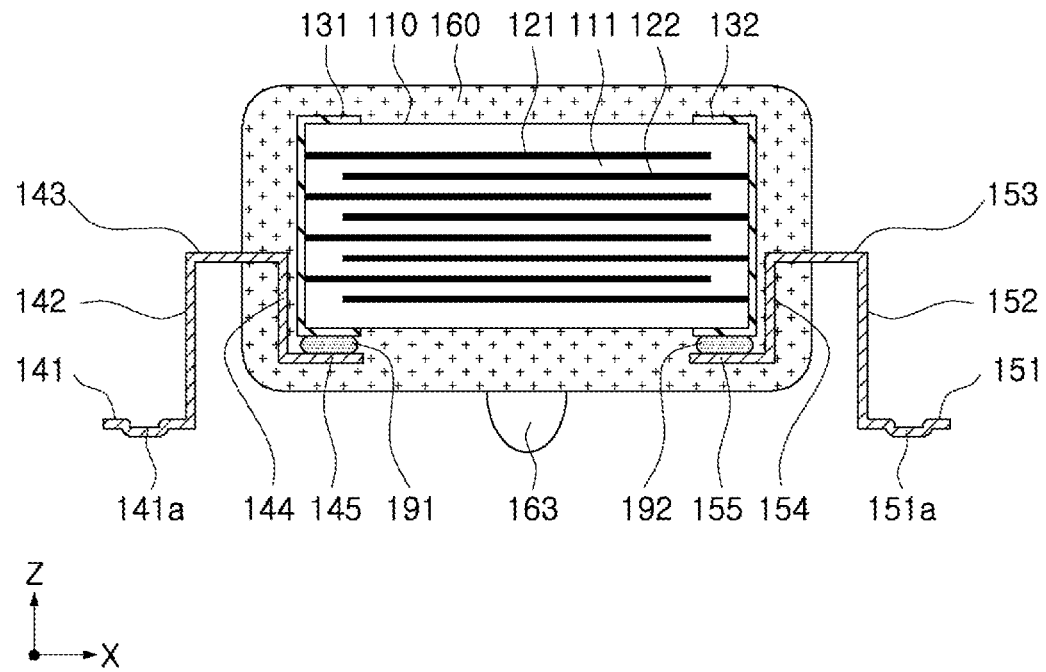
FIGS. 17 and 18 are cross-sectional views illustrating another forms of a protruding portion in FIG. 10, respectively.
Figure 18:
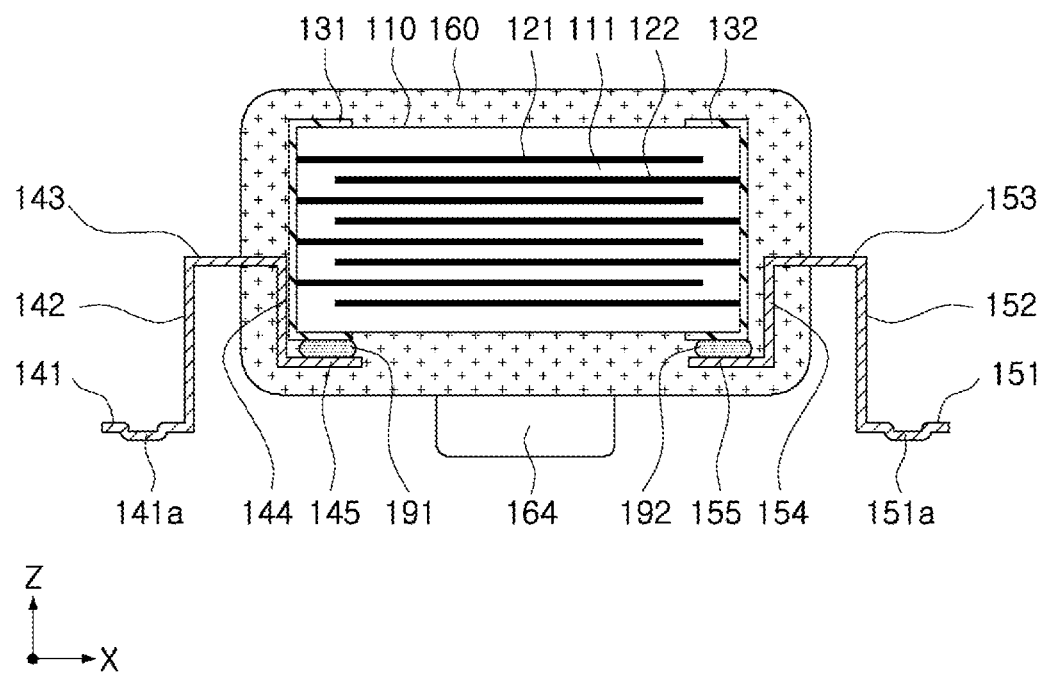

Meanwhile, in an embodiment, it is illustrated and described that a lower end of the plurality of protruding portions 161 and 162 has a triangular shape having a lower end which is pointed, but an embodiment of the present disclosure is not limited thereto. For example, as illustrated in FIG. 17, the protruding portion 163 may have a semicircular shape having a lower end which is convex. Alternatively, as illustrated in FIG. 18, the protruding portion 164 may have a quadrangular shape having a lower surface which is flat.

Figure 11:
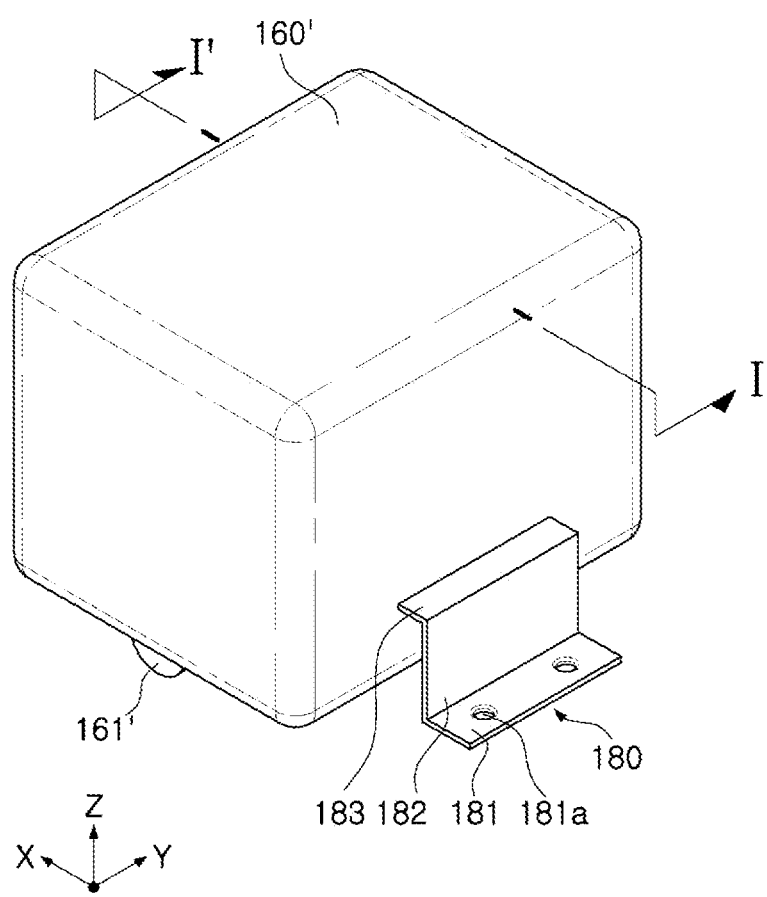
FIG. 11 is a perspective view illustrating an electronic component according to another embodiment of the present disclosure.
Figure 12:
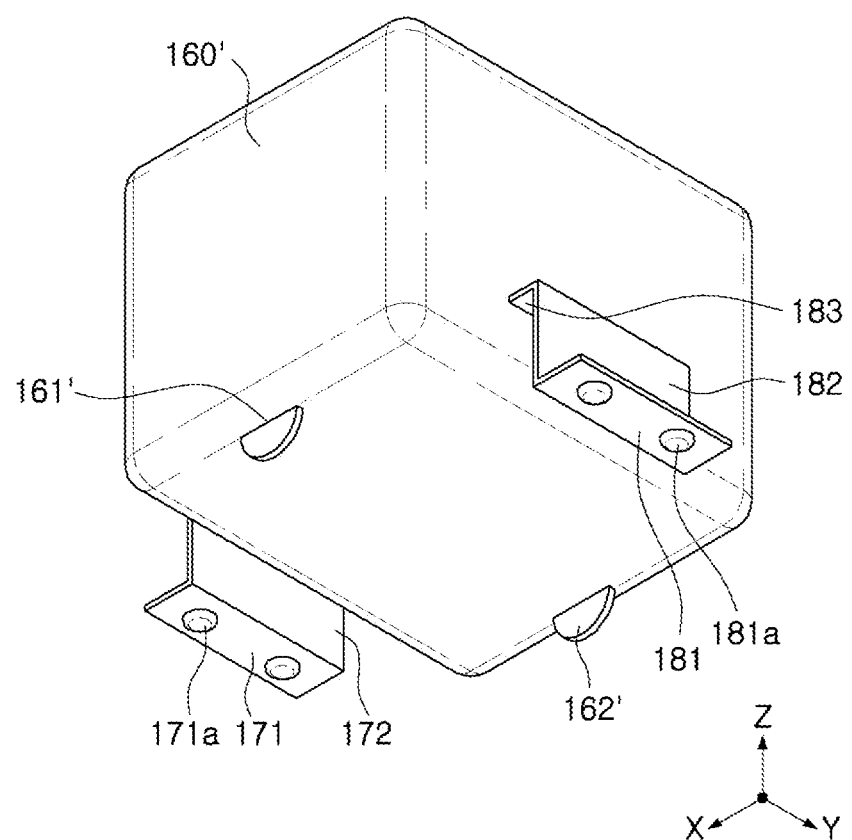
FIG. 12 is a perspective view illustrating a bottom surface of a capsule portion in FIG. 11.
Figure 13:
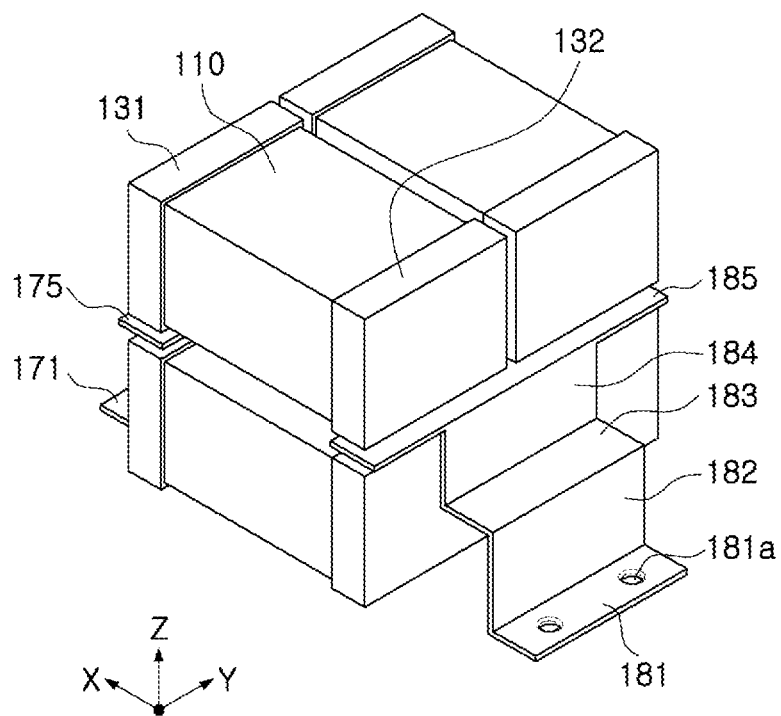
FIG. 13 is a perspective view illustrating the electronic component of FIG. 11 from which a capsule portion is removed.
Figure 14:
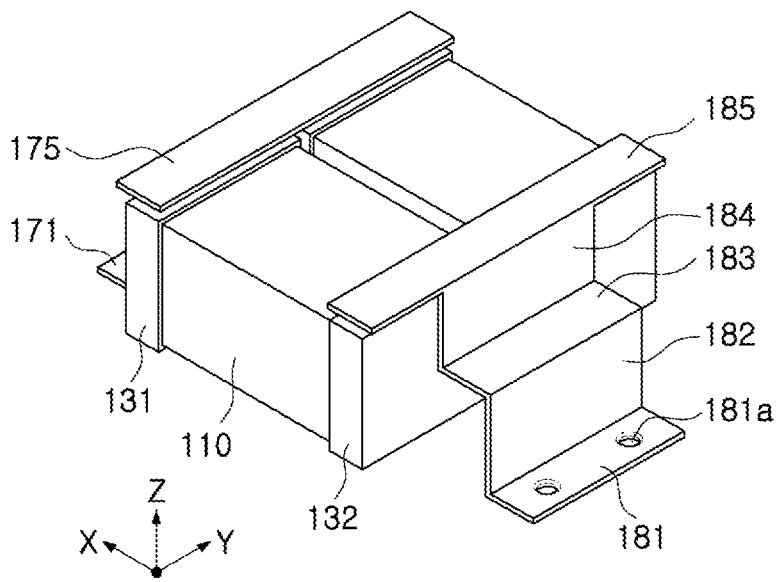
FIG. 14 is a perspective view illustrating the electronic component of FIG. 13 from which multilayer capacitors in a row in an upper side are removed.
Figure 15:
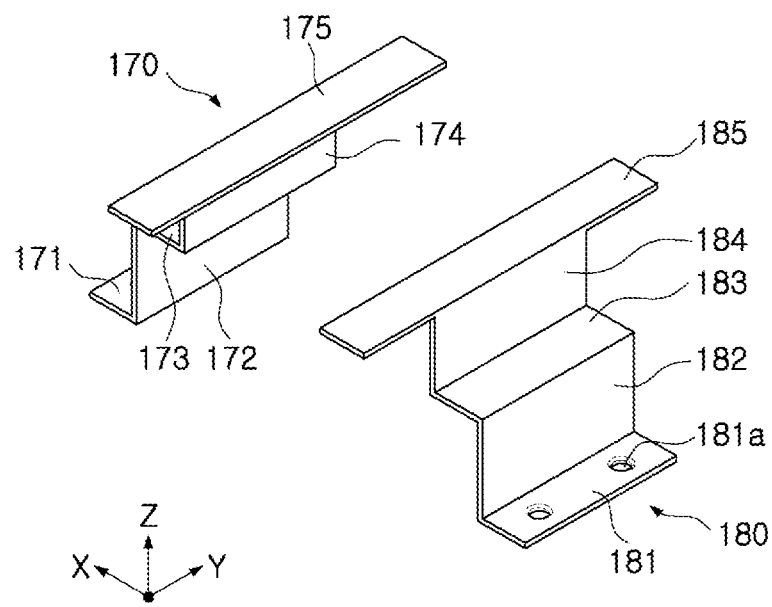
FIG. 15 is a perspective view illustrating first and second metal frames in FIG. 11.
Figure 16:
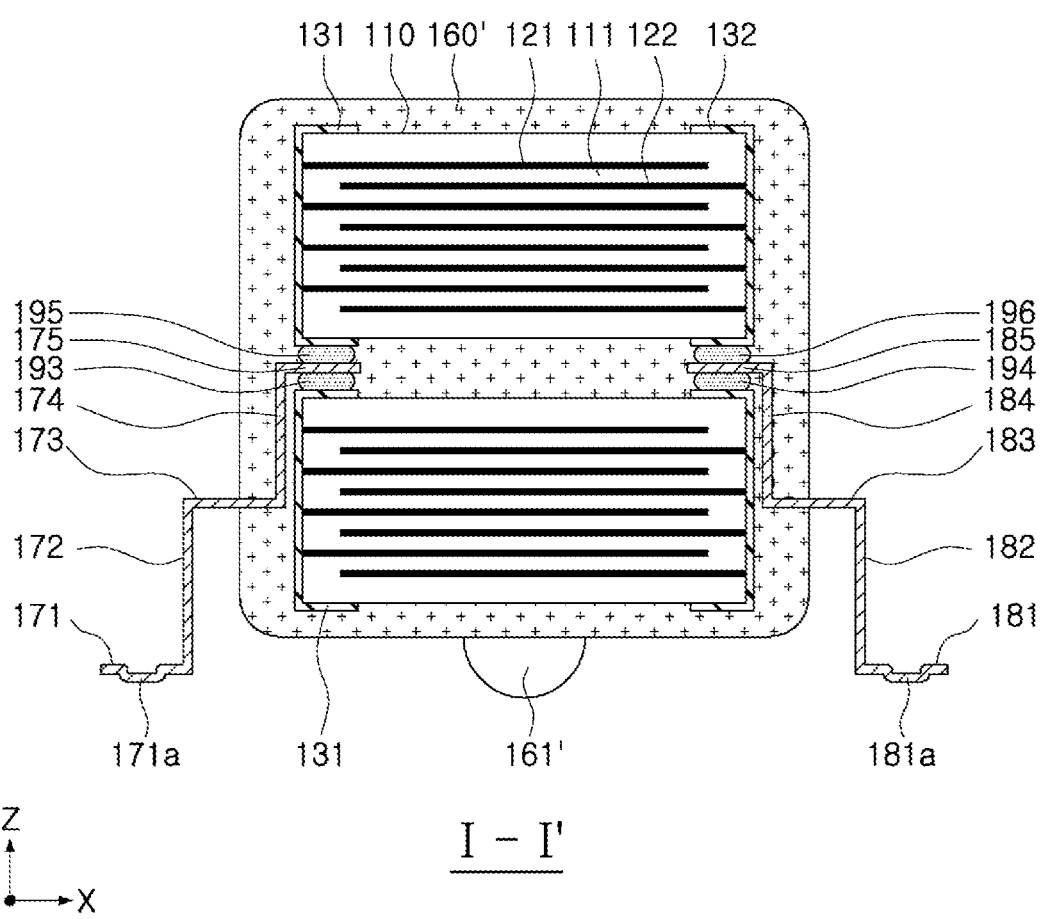
FIG. 16 is a cross-sectional view taken along line I-I' of FIG. 11.

FIG. 11 is a perspective view illustrating an electronic component according to another embodiment of the present disclosure, FIG. 12 is a perspective view illustrating a bottom surface of a capsule portion in FIG. 11, and FIG. 13 is a perspective view illustrating the electronic component in FIG. 11 from which the capsule portion is removed. FIG. 14 is a perspective view illustrating the electronic component in FIG. 13 from which multilayer capacitors in a row in an upper side are removed, FIG. 15 is a perspective view illustrating first and second metal frames in FIG. 11, and FIG. 16 is a cross-sectional view taken along line I-I' of FIG. 11.

Here, a structure of a multilayer capacitor is similar to that according to an embodiment described previously, so a detailed description thereof will be omitted to avoid duplication. In addition, shapes of first and second metal frames having a different structure from those of the above-described embodiments and an arrangement structure of a plurality of stacked capacitors will be described in detail with reference to drawings.

Referring to FIGS. 11 to 16, in a capacitor array according to an embodiment, a plurality of multilayer capacitors 100, arranged side by side in the Y direction, a second direction intersecting the first direction, are arranged in two rows in the Z direction, the third direction.

Here, in an embodiment, the capacitor array has a structure in which four multilayer capacitors 100 are arranged in the 2×2 array.

Moreover, a capsule portion 160' encapsulates the capacitor array to allow first and second metal frames 170 and 180 to be lead-out to the outside.

In addition, the first connection portion of the first metal frame 170 may include a first vertical portion 172 extending upwardly from one end of the first mounting portion 171, a third horizontal portion 173 extending horizontally from the fifth vertical portion 172, and a sixth vertical portion 174 extending upwardly from one end of the third horizontal portion 173 and having one end to which the first support portion 175 is connected.

Moreover, the second connection portion of the second metal frame 180 may include a seventh vertical portion 182 extending upwardly from one end of the second mounting portion 181, a fourth horizontal portion 183 extending horizontally from the seventh vertical portion 182, and an eighth vertical portion 184 extending upwardly from one end of the fourth horizontal portion 183 and having one end to which the second support portion 185 is connected In addition, a plurality of first external electrodes 131 in a first row of a lower side and in a second row on an upper side may be bonded to upper and lower surfaces of the first support portion 175, respectively, while a plurality of second external electrodes 132 in a first row of a lower side and in a second row on an upper side may be bonded to upper and lower surfaces of the second support portion 185.

In this case, a third conductive bonding layer 193 may be disposed between a first band portion of the first external electrode 131 of a multilayer capacitor, arranged in a first row of a lower side, and a lower surface of the first support portion 175, while a fourth conductive bonding layer 195 may be disposed between a first band portion of the first external electrode 131 of a multilayer capacitor, arranged in a second row on an upper side, and an upper surface of the first support portion 175.

In addition, a fifth conductive bonding layer 194 may be disposed between a second band portion of the second external electrode 132 of a multilayer capacitor, arranged in a first row of a lower side, and a lower surface of the second support portion 185, while a sixth conductive bonding layer 196 may be disposed between a second band portion of the second external electrode 132 of a multilayer capacitor, arranged in a second row on an upper side, and an upper surface of the second support portion 185.

Figure 19:
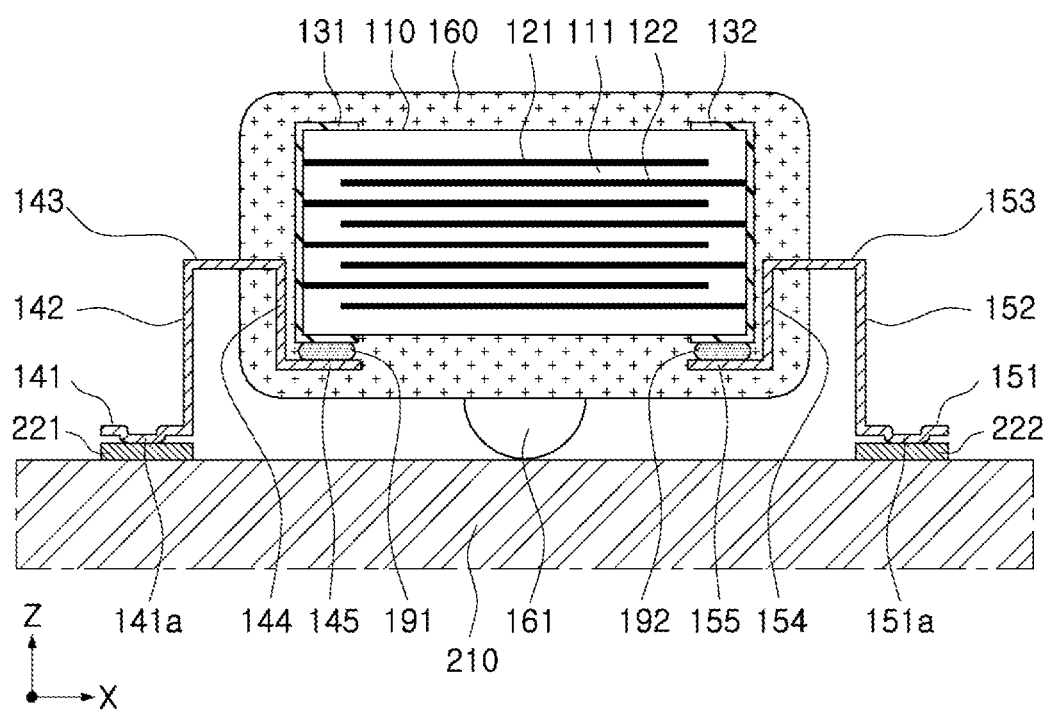
FIG. 19 is a schematic cross-sectional view illustrating an electronic component according to an embodiment of the present disclosure mounted on a board.

FIG. 19 is a schematic cross-sectional view illustrating an electronic component according to an embodiment of the present disclosure mounted on a board.

Referring to FIG. 19, a board having the electronic component mounted thereon according to an embodiment includes a board 210, and first and second land patterns 221 and 222 spaced apart from each other on an upper surface of the board 210.

In this case, the electronic component is mounted on the board 210 while first and second protrusions 141a and 151a of the first and second mounting portions 141 and 151 of the first and second metal frames 140 and 150 are located to be in contact with and connected to upper portions of the first and second land patterns 221 and 222.

In an embodiment, an electronic component, including a metal frame, may be mounted on a board by laser welding the first and second protrusions.

When a multilayer capacitor according to the related art is mounted on a board, a capacitor body and the board are in direct contact with each other by solder, so thermal or mechanical deformation, occurring in the board, is directly transferred to a multilayer capacitor, and thus it is difficult to secure a high level of reliability.

However, in an embodiment, first and second metal frames are bonded to both surfaces of a multilayer capacitor in the X direction to secure a gap between the multilayer capacitor and the board having the electronic component mounted thereon, stress from the board is prevented from being directly transferred to the multilayer capacitor, and thus reliability may be improved.

Moreover, in an electronic component having a structure to which a metal frame is bonded, according to the related art, a land pattern of a board and a metal frame of a multilayer capacitor are fixed using solder.

In this case, when soldering is performed to mount an electronic component on a board, problems, in which bonded portions of a metal frame and a multilayer capacitor are melted and separated from each other due to a reflow temperature, often occur.

In an embodiment, a protruding portion is formed in a mounting portion, and thus the protruding portion and the land pattern are in contact with each other and welded using a laser, so the metal frame and the land pattern are bonded to each other.

Thus, the mounting density is increased in a limited space and a sufficient insulation distance between left and right metal frames is secured and thus insulation between the adjacent electronic components is secured, and a separation problem between a metal frame and a multilayer capacitor caused by soldering according to the related art may be solved.

Moreover, when an electronic component according to an embodiment is mounted on a board, a protruding portion, protruding from a lower surface of a capsule portion, is in contact with an upper portion of a board to check a mounting position of an electronic component, and thus positional accuracy may be improved when being mounted on the board.

As set forth above, according to example embodiments of the present inventive concept, a capacitor array is encapsulated by a capsule portion and a plurality of protruding portions are formed on a lower surface of the capsule portion, and thus a metal frame stably supports a capacitor array, and flatness of a capsule portion is prevented from being distorted when an electronic component is mounted on a board, and thus degradation of positional accuracy of the electronic component may be prevented.

While example embodiments have been shown and described above, it will be apparent to those skilled in the art that modifications and variations could be made without departing from the scope of the present disclosure, as defined by the appended claims.

What is claimed is:

1. An electronic component, comprising:
   a capacitor array having a multilayer capacitor, the multilayer capacitor including a body and first and second external electrodes disposed on both ends of the body in a first direction, respectively;
   a first metal frame including a first support portion attached to the first external electrode of the capacitor array, a first mounting portion located lower than a lowermost portion of the first external electrode in a third direction perpendicular to the first direction and having a first protrusion protruding downwardly, and a first connection portion connecting the first support portion to the first mounting portion;
   a second metal frame including a second support portion attached to the second external electrode of the capacitor array, a second mounting portion located lower than a lowermost portion of the second external electrode in the third direction and having a second protrusion protruding downwardly, and a second connection portion connecting the second support portion to the second mounting portion; and
   a capsule portion encapsulating the capacitor array to expose the first mounting portion of the first metal frame and the second mounting portion of the second metal frame, and having a plurality of protruding portions spaced apart from edges thereof opposing in the first direction and on a lower surface of the capsule portion in the third direction with predetermined intervals therebetween.

2. The electronic component of claim 1, wherein a lower end of each of the plurality of protruding portions is located below the first and second mounting portions.

3. The electronic component of claim 1, wherein the plurality of protruding portions include one protruding portion in the vicinity of each of both edges opposing each other in a second direction intersecting the first direction and perpendicular to the third direction on the lower surface of the capsule portion.

4. The electronic component of claim 3, wherein each of the plurality of protruding portions is located in the center of the capsule portion in the first direction.

5. The electronic component of claim 3, wherein each of the plurality of protruding portions is arranged in a position offset from the center of the capsule portion in the first direction.

6. The electronic component of claim 3, wherein the plurality of protruding portions are arranged on the lower surface of the capsule portion so as to be positioned diagonally with respect to a second direction intersecting the first direction and perpendicular to the third direction.

7. The electronic component of claim 1, wherein the plurality of protruding portions include two or more protruding portions spaced apart from each other in the first direction in the vicinity of each of both edges opposing each other in a second direction intersecting the first direction and perpendicular to the third direction on the lower surface of the capsule portion.

8. The electronic component of claim 1, wherein a lower end of the plurality of protruding portions has any one of a triangular shape having a lower end which is pointed, a semicircular shape having a lower end which is convex, or a quadrangular shape having a lower end which is flat.

9. The electronic component of claim 1, wherein a lowermost end of the plurality of protruding portions is arranged in a height lower than or equal to a height of the first and second mounting portions in the third direction.

10. The electronic component of claim 1, wherein the capacitor array comprises a plurality of multilayer capacitors arranged side by side in the second direction,
   the first connection portion includes a first vertical portion extending upwardly from one end of the first mounting portion in the third direction, a first horizontal portion extending horizontally from the first vertical portion in the first direction, and a second vertical portion extending downwardly from one end of the first horizontal portion in the third direction and having one end to which the first support portion is connected,
   the second connection portion includes a third vertical portion extending upwardly from one end of the second mounting portion in the third direction, a second horizontal portion extending horizontally from the third vertical portion in the first direction, and a fourth vertical portion extending downwardly from one end of the second horizontal portion in the third direction and having one end to which the second support portion is connected, and
   the first external electrodes are attached to an upper surface of the first support portion, and the second external electrodes are attached to an upper surface of the second support portion.

11. The electronic component of claim 10, wherein the second and fourth vertical portions are spaced apart from the first and second external electrodes, respectively.

12. The electronic component of claim 10, wherein a conductive bonding layer is disposed on each of the upper surfaces of the first and second support portions.

13. The electronic component of claim 1, wherein the capacitor array comprises a plurality of multilayer capacitors arranged side by side in a second direction intersecting the first direction and perpendicular to the third direction and arranged in two rows in the third direction,
the first connection portion includes a fifth vertical portion extending upwardly from one end of the first mounting portion in the third direction, a third horizontal portion extending horizontally from the fifth vertical portion in the first direction, and a sixth vertical portion extending upwardly from one end of the third horizontal portion in the third direction and having one end to which the first support portion is connected,
the second connection portion includes a seventh vertical portion extending upwardly from one end of the second mounting portion in the third direction, a fourth horizontal portion extending horizontally from the seventh vertical portion in the first direction, and an eighth vertical portion extending upwardly from one end of the fourth horizontal portion in the third direction and having one end to which the second support portion is connected, and
the first external electrodes in a first row of a lower side and in a second row of an upper side are attached to upper and lower surfaces of the first support portion, respectively, and the second external electrodes in the first row and the second row are attached to upper and lower surfaces of the second support portion, respectively.

14. The electronic component of claim 13, wherein the sixth and eighth vertical portions are spaced apart from the first and second external electrodes in the first row of the lower side, respectively.

15. The electronic component of claim 13, wherein a conductive bonding layer is disposed on each of the upper and lower surfaces of the first support portion and each of the upper and lower surfaces of the second support portion.

16. The electronic component of claim 1, wherein each of the first and second protrusions is provided as a plurality of protrusions.

17. The electronic component of claim 1, wherein the body of multilayer capacitor includes:
a dielectric layer; and
first and second internal electrodes alternatively stacked with the dielectric layer interposed therebetween and exposed through both surfaces of the body in the first direction to allow one ends to be connected to the first and second external electrodes, respectively.

18. The electronic component of claim 1, wherein the first and second external electrodes include:
first and second head portions disposed on both surfaces of the body opposing in the first direction, respectively; and
first and second band portions extending from the first and second head portions to a portion of a lower surface of the body, respectively.

19. The electronic component of claim 18, wherein the first and second support portions of the first and second metal frames are attached to the first and second band portions of the first and second external electrodes, respectively.

20. A board having an electronic component mounted thereon, comprising:
a board having first and second land patterns spaced apart from each other on an upper surface of the board, and
the electronic component according to of claim 1 mounted to allow the first and second protrusions to be in contact with the first and second land patterns of the board.

* * * * *